(12) United States Patent
Koma et al.

(10) Patent No.: US 6,439,969 B1
(45) Date of Patent: Aug. 27, 2002

(54) APPARATUS AND METHOD OF CHAMFERING WAFER

(75) Inventors: Kikuo Koma, Toyama; Shirou Murai, Kanagawa; Muneaki Kaga; Michihiro Takata, both of Toyama, all of (JP)

(73) Assignee: Nippei Toyama Corporation, Tokyo (JP)

( * ) Notice: Subject to any disclaimer, the term of this patent is extended or adjusted under 35 U.S.C. 154(b) by 0 days.

(21) Appl. No.: 09/522,910

(22) Filed: Mar. 10, 2000

(30) Foreign Application Priority Data

Mar. 10, 1999 (JP) .......................................... 11-063670

(51) Int. Cl.[7] .............................. B24B 1/00; B24B 7/00
(52) U.S. Cl. ............................. 451/41; 451/11; 451/44; 451/65
(58) Field of Search ....................... 438/462; 257/618; 451/44, 65, 14, 11, 41

(56) References Cited

U.S. PATENT DOCUMENTS

| 4,783,225 A | * 11/1988 | Maejima et al. ............ 428/66.7 |
| 4,905,425 A | * 3/1990 | Sekigawa et al. ............. 451/41 |
| 5,117,590 A | * 6/1992 | Kudo et al. .................... 451/44 |
| 5,185,965 A | 2/1993 | Ozaki ....................... 51/283 E |
| 5,271,185 A | * 12/1993 | Hosokawa ................... 451/136 |
| 5,445,554 A | 8/1995 | Hosokawa ..................... 451/11 |
| 5,458,529 A | 10/1995 | Hasegawa et al. .......... 451/177 |
| 5,490,811 A | 2/1996 | Hosokawa .................. 451/239 |

FOREIGN PATENT DOCUMENTS

| EP | 0 686 460 A1 | 12/1995 | ............. B24B/9/06 |
| JP | 2611829 | 2/1997 | ........... B24B/19/02 |
| JP | 9-168953 | 6/1997 | ............. B24B/9/00 |

OTHER PUBLICATIONS

Abstract of Japanese Application No. 2180554, dated Jul. 13, 1990.

* cited by examiner

*Primary Examiner*—Caridad Everhart
*Assistant Examiner*—Lex H. Malsawma
(74) *Attorney, Agent, or Firm*—Sughrue Mion, PLLC

(57) ABSTRACT

Chamfering C1 is performed along the edge of a notch groove by the center 01 of a grindstone 5. Change to grindstone center 02 is performed to perform chamfering C2 along the edge of the notch groove. Similarly, chamfering C3, C4 and C5 are formed. A grindstone having a large diameter can be employed. Only control of the diameter of the grindstone is required to maintain the shape. Satisfactory surface roughness can be realized. It is possible to improve surface roughness of a notch groove of a wafer and realize high efficiency.

26 Claims, 16 Drawing Sheets

APPARATUS AND METHOD OF CHAMFERING WAFER

BACKGROUND OF THE INVENTION

1. Field of The Invention

The present invention relates to a wafer, an apparatus and a method of chamfering a wafer, particularly a semiconductor wafer. The apparatus and method of chamfering a semiconductor wafer, includes chamfering a notch groove of the semiconductor wafer using a disc shape grindstone so as to form an edge of the wafer into a concave-shape in a pseudo manner.

2. Description of the Related Art

In a conventional apparatus and process for manufacturing a semiconductor device, a notch groove is formed by cutting a portion of the periphery of a semiconductor wafer into a V-shape or a circular-arc shape in order to easily align the orientation of crystal of the semiconductor wafer. The V-shape notch groove is widely employed due to enabling a limited area of the wafer to efficiently be used and having excellent locating accuracy.

In such a process for manufacturing the semiconductor device, the periphery of the semiconductor wafer sometimes comes in contact with a portion of an apparatus for use in the manufacturing process. Such a contact causes dust and a crack to occur. In order to prevent such a contact, the periphery of the semiconductor wafer is chamfered in general.

A conventional method of chamfering the notch groove is shown in FIGS. 15 and 16.

In FIGS. 15 and 16, the reference numeral 1 represents a wafer; 3, notch groove; 10, a formed grindstone 10; 11, a grindstone shaft.

The phrase "formed grindstone" means a grindstone having a grinding surface a cross-section which is substantially the same as the ground portion of the wafer 1 after grinding operation, as shown in FIG. 15. At this time, the formed grindstone 10 is formed into a hand-drum shape.

As shown in FIG. 15, the formed grindstone 10 is a rotatable grindstone having a bus line 10a and rotates around grindstone shaft 11. The bus line 10a of the formed grindstone 10 is formed into a concave shape corresponding to a convex bus line of the wafer. The notch groove 3 formed into a substantially V-shape in preprocess comprises straight portions 3a, a groove bottom 3b, and orifices 3c as shown in FIG. 16. The notch groove 3 is chamfered by the formed grindstone 10 as shown in FIG. 16. A curvature radius r (a diameter d) in the center of the formed grindstone 10 is smaller than that of a groove bottom 3b of the notch groove 3.

The chamfering process is performed by chamfering the notch groove 3 as drawing such a tool locus 13 shown in FIG. 16 by the formed grindstone 10 while the grindstone shaft 11 is being maintained to be in parallel with the center line of the wafer 1.

The notch grooves of the wafer before/after chamfering is performed are shown respectively in FIGS. 17 and 18. A surface 3f of the wafer 1 shown in FIG. 17 is chamfered by formed grindstone 10 so as to form chamferings C1, C2 and C3 as shown in FIG. 18.

Since the straight portion 3a of the notch groove 3 is brought into contact with a locating pin having a diameter of about 3 mm and the groove bottom 3b has a small curvature radius, the diameter d of the formed grindstone 10 is about 2 mm. Therefore, the grindstone is rotated at about 100,000 rpm to realize required grinding speed.

Further, since the diameter of the grindstone is small, a metal-bond diamond grindstone is employed as the grindstone to prevent abrasion of the grindstone. The metal-bond grindstone, however, has a maximum surface roughness Rmax of 1 μm which causes the wafer to sustain damage of about 10 μm in the form of a crack layer and polishing such as buffing, which is performed as a following process, takes about 10 minutes.

Moreover, in order to subject the mirror-surface polishing/finishing process into the chamfered portion of the notch groove similar to the chamfered portion of the peripheral side surface of the disc shape wafer, surface roughness of the chamfered portion of the notch groove must be improved, that is grinding must be performed to realize surface roughness of about 0.1 μm. A resinoid-bond grindstone is used so that the notch groove is chamfered to realize the surface roughness of about 0.1 μm. However, the use of the resinoid-bond grindstone excessively causes abrasion of the grindstone and considerable deformation of the shape of the grindstone. Accordingly, the shape of the chamfered portion deteriorates.

SUMMARY OF THE INVENTION

Accordingly, an object of the present invention is to provide a wafer, an apparatus and a method of chamfering a notch groove of a wafer, in which the wafer is chamfered so as to have satisfied surface roughness of the formed notch groove and reduced abrasion of the grindstone.

According to a first aspect of the present invention, there is provided a method of chamfering a notch groove of a wafer formed into a disc shape, comprising the steps of:

using a wafer having a notch groove surface, means for holding the wafer, a grindstone frame incorporating a grindstone formed into a disc shape and structured such that a leading end of a radial-directional cross section of an peripheral side surface obtained by cutting with a plane including a grindstone axis has a curvature radius smaller than a minimum curvature radius of the notch groove and moving means which is capable of relatively moving the wafer and the grindstone along the notch groove of the wafer on a plane which is in parallel with the principal plane of the wafer and relatively moving substantially along the chamfering shape of the wafer on a plane intersecting the parallel plane;

(1) making the central line of the wafer and the central line of the grindstone to intersect each other;

(2) causing the grindstone to act on the notch groove such that a locus of a tool is drawn on a plane which is in parallel with the principal plane of the wafer to relatively move the grindstone and the wafer along the notch groove to perform chamfering along the notch groove;

(3) relatively moving the grindstone and the wafer on a plane intersecting the plane in accordance with a chamfered shape of the notch groove to allow the grindstone and the wafer to correspond to the notch groove in a portion except for the chamfered portion;

(4) causing the grindstone to act on the notch groove on a plane which is in parallel with the plane which is in parallel with the principal plane of the wafer and which is different from the plane such that a locus of a tool is drawn to relatively move the grindstone and the wafer along the notch groove to furthermore performing chamfering along the notch groove;

(5) relatively moving the grindstone and the wafer on a plane intersecting the plane in accordance with the chamfered shape of the notch groove to allow the grindstone and the wafer to correspond to the notch groove in a portion except for the chamfered portion; and (6) similarly chamfering the notch groove into a polygonal shape.

According to a second aspect of the present invention, there is provided a method of chamfering a notch groove of a wafer formed into a disc shape, comprising the steps of:

using a wafer having a notch groove surface, means for holding the wafer, a grindstone frame incorporating a grindstone formed into a disc shape and structured such that a leading end of a radial-directional cross section of an peripheral side surface obtained by cutting with a plane including a grindstone axis has a curvature radius smaller than a minimum curvature radius of the notch groove and moving means which is capable of relatively moving the wafer and the grindstone along the notch groove of the wafer on a plane which is in parallel with the principal plane of the wafer and relatively moving substantially along the chamfering shape of the wafer on a plane intersecting the parallel plane;

(1) making the central line of the wafer and the central line of the grindstone to intersect each other;

(2) causing the grindstone to act on the notch groove such that a locus of a tool is drawn on a plane which is in parallel with the principal plane of the wafer to relatively move the grindstone and the wafer along the notch groove to perform chamfering along the notch groove;

(3) relatively moving the grindstone and the wafer on a plane intersecting the plane in accordance with a chamfered shape of the notch groove to allow the grindstone and the wafer to correspond to the notch groove at a position adjacent to the chamfered portion such that portions of the grindstone and the wafer overlap the chamfered portion;

(4) causing the grindstone to act on the notch groove such that a locus of a tool is drawn on a plane which is in parallel with the plane which is in parallel with the principal plane of the wafer and which is different from the plane to perform chamfering along the notch groove at a position adjacent to the chamfering;

(5) relatively moving the grindstone and the wafer on a plane intersecting the plane in accordance with the chamfered shape of the notch groove to allow the grindstone and the wafer to correspond to the notch groove at a position adjacent to the chamfered portion such that portions of the grindstone and the wafer overlap the chamfered portion; and (6) similarly chamfering the notch groove into a polygonal shape.

According to a third aspect of the present invention, there is provided a method of chamfering a notch groove of a wafer formed into a disc shape, comprising the steps of:

using a wafer having a notch groove surface, means for holding the wafer, a grindstone frame incorporating a grindstone formed into a disc shape and structured such that a leading end of a radial-directional cross section of an peripheral side surface obtained by cutting with a plane including a grindstone axis has a curvature radius smaller than a minimum curvature radius of the notch groove and moving means which is capable of relatively moving the wafer and the grindstone along the notch groove of the wafer on a plane which is in parallel with the principal plane of the wafer and relatively moving substantially along the chamfering shape of the wafer on a plane intersecting the parallel plane;

(1) making the central line of the wafer and the central line of the grindstone to intersect each other;

(2) causing the grindstone to act on the notch groove and a circular peripheral side surface such that a locus of a tool is drawn on a plane which is in parallel with the principal plane of the wafer to relatively move the grindstone and the wafer at a position corresponding to the notch groove of the wafer and add rotation of the wafer such that the position of the grindstone is fixed at a position corresponding to the peripheral side surface of the wafer to perform chamfering along the notch groove and the circular peripheral side surface of the wafer;

(3) relatively moving the grindstone and the wafer on a plane intersecting the plane in accordance with chamfered shapes of the notch groove and the circular peripheral side surface to allow the grindstone and the wafer to correspond to the notch groove and the circular peripheral side surface of the wafer in a portion except for the chamfered portion;

(4) causing the grindstone to act on the notch groove and the circular peripheral side surface of the wafer on a plane which is in parallel with the plane which is in parallel with the principal plane of the wafer and which is different from the plane such that a locus of a tool is drawn to relatively move the grindstone and the wafer at a position corresponding to the notch groove of the wafer and add ratio of the wafer such that the position of the grindstone is fixed at a position corresponding to the peripheral side surface of the wafer to furthermore perform chamfering along the notch groove and the circular peripheral side surface of the wafer;

(5) relatively moving the grindstone and the wafer on a plane intersecting the plane in accordance with the chamfered shape of the notch groove and the circular peripheral side surface to allow the grindstone and the wafer to correspond to the notch groove and the circular peripheral side surface of the wafer in a portion except for the chamfered portion; and (6) similarly chamfering the notch groove into a polygonal shape.

According to a fourth aspect of the present invention, there is provided a wafer comprising: a notch groove formed in a semiconductor wafer formed into a disc shape, wherein the notch groove is chamfered into a polygonal shape.

Note that a polygonal shape generally means a shape which comprises at least three straight lines. However, in this specification, the polygonal shape comprises at least three slightly curved bus lines, each of which defines the chamfered surfaces as clearly shown in FIG. 6.

According to a fifth aspect of the present invention, there is provided a wafer according to the fourth aspect, wherein chamfering of the notch groove is performed such that a plane which is in parallel with a center line of the wafer is included. In other words, as shown in FIG. 6 a slightly curved bus line defining the outermost chamfered surface C3 of the wafer 1 is substantially extended in parallel with the center line of the wafer 1.

According to a sixth aspect of the present invention, there is provided a wafer according the fourth aspect of the fifth aspect, wherein the polygonal shape has surfaces each of which is formed into a concave shape.

Further, the above-mentioned object can be achieved by a chamfering apparatus for a wafer with a notch groove, according to the present invention comprising:

a holder rotatably holding a wafer with a notch groove;

a grindstone frame rotatably supporting a disc shaped grindstone, the grindstone having a peripheral side surface at a leading end in its radial direction which has a curvature radius in a cross-section smaller than a minimum curvature radius of the notch groove, the cross section obtained by cutting with a plane containing the center axis of the grindstone, the central line of the wafer and the central line of the grindstone defining a skew line relationship;

moving member capable of relatively moving the wafer and the grind stone along the notch groove of the wafer on a parallel-extending plane which is in parallel with the principal plane of the wafer and relatively moving substantially along the chamfering shape of the wafer on an intersecting plane intersecting the parallel-extending plane at a predetermined angle; and a controller controllable the relative movements between the wafer and the grindstone on the parallel-extending plane and the intersecting plane wherein the controller causes the grind stone to act on the notch groove while relatively moves the grindstone and the wafer in such a manner that a contact position therebetween is moved along the notch groove while a first tool moving locus is drawn on a first parallel plane which is in parallel with the principal plane of the wafer, to thereby perform chamfering a first chamfered portion along the notch groove;

relatively moves the grind stone and the wafer in such a manner that the contact position therebetween is moved in accordance with a chamfered shape of the notch groove so as to allow the contact position to correspond to a second chamfered portion of the notch while a second tool moving locus is drawn on a first intersecting plane intersecting the parallel-extending plane at the predetermined angle, the second chamfered portion being substantially different from the first chamfered portion thus chamfered;

causes the grindstone to act on the notch groove while relatively moves the grindstone and the wafer in such a manner that the contact position therebetween is moved along the notch groove while a third tool moving locus is drawn on a second parallel plane which is in parallel with the principal plane of the wafer and is different from the first parallel plane, to thereby perform chamfering the second chamfered portion along the notch groove; and relatively moves the grind stone and the wafer in such a manner that the contact position therebetween is moved in accordance with the chamfered shape of the notch groove so as to allow the contact position to correspond to a third chamfered portion of the notch while a fourth tool moving locus is drawn on a second intersecting plane intersecting the parallel-extending plane at the predetermined angle, the third chamfered portion being substantially different from the first and second chamfered portions thus chamfered; and causes the grindstone to act on the notch groove while relatively moves the grindstone and the wafer in such a manner that the contact position therebetween is moved along the notch groove while a fifth tool moving locus is drawn on a third parallel plane which is in parallel with the principal plane of the wafer and is different from the first and second parallel planes, to thereby perform chamfering the third chamfered portion along the notch groove, thereby chamfering the notch groove into a polygonal shape.

In the chamfering apparatus, it is preferable that the first intersecting plane is different from the second intersecting plane.

In addition, in the chamfering apparatus, the predetermined angle may be about 90 degrees.

Further, in the chamfering apparatus, it is advenatgeous that the controller controls the moving member in such a manner that the first and second chamfered portions are partially overlapped with each other, and also the second and third chamfered portions are partially overlapped with each other.

Furthermore, in the chamfering apparatus, it is preferable that the controller controls the moving member in such a manner that each of the first, second and third chamfered portions is continuously provided on the notch groove and a circular peripheral side surface of the wafer.

In this specification, the notch groove includes so-called an orientation flat shape as well as the V-shape (some what shape variation included).

According to the above-mentioned a wafer, an apparatus and a method of chamfering a notch groove of a wafer according to present invention, (1) Since the grindstone having the large diameter can be used, the lifetime of the grindstone can significantly be elongated.

(2) Notch grooves having the same shape/predetermined shape can always be formed by controlling the outer diameter of the grindstone regardless of curvature radius of the leading end of grindstone, if the cross sectional shape of the leading end of grindstone, which obtained by cutting at a plane including the grindstone shaft, has a size such that the cross sectional shape thereof can contact with the bottom of the notch groove of the wafer.

(3) Since the problem of deformation of the formed grindstone (having a small diameter) adaptable to the cross sectional shape of chamfering does not arise, the lifetime of the grindstone can be elongated and the cross sectional shape of chamfering can always be obtained stably.

(4) The conditions under which grinding is performed to realize required surface roughness of the chamfered portion are not severe as compared with the conditions of grinding required when a formed grindstone (having a small diameter) is employed. Therefore, chamfering finishing by mirror-surface polishing/finishing process can be performed.

(5) A chamfering of the peripheral side surface of the wafer can be also performed by grinding continually after chamfering of the notch groove.

DETAILED DESCRIPTION OF THE PREFERRED EMBODIMENTS

Referring to the accompanying drawings, embodiments of the present invention will now be described.

First Embodiment

Figure 1:
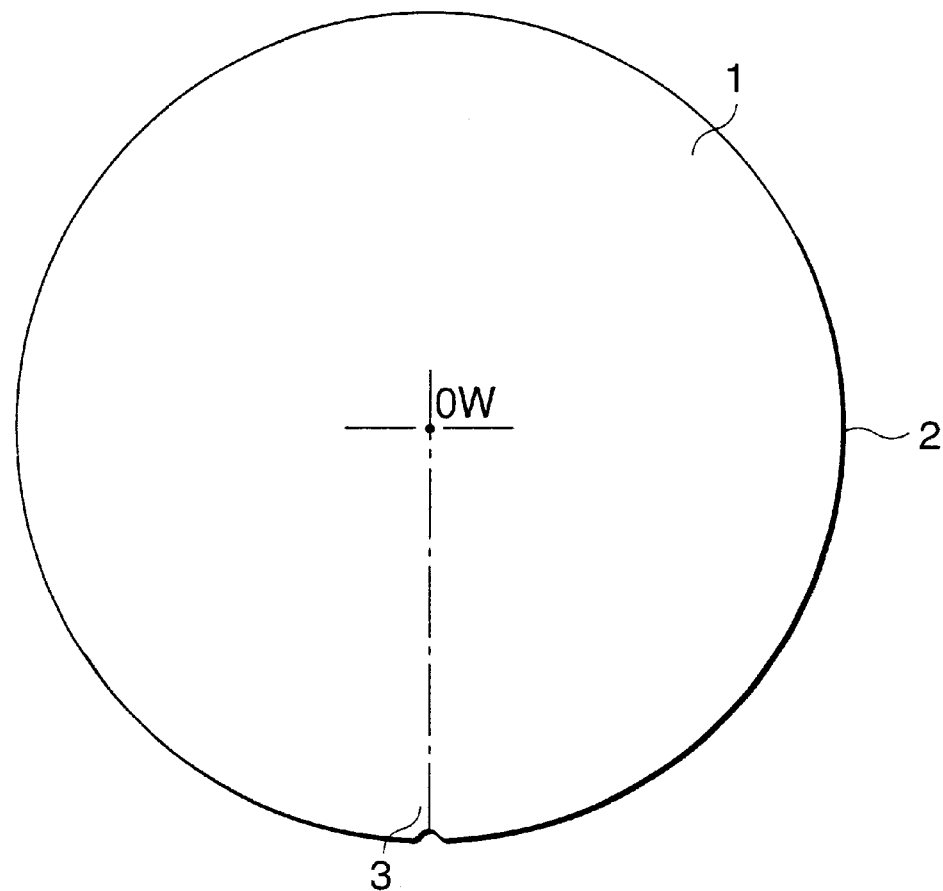
FIG. 1 is a plan view showing a wafer before chamfering is performed.
Figure 2:
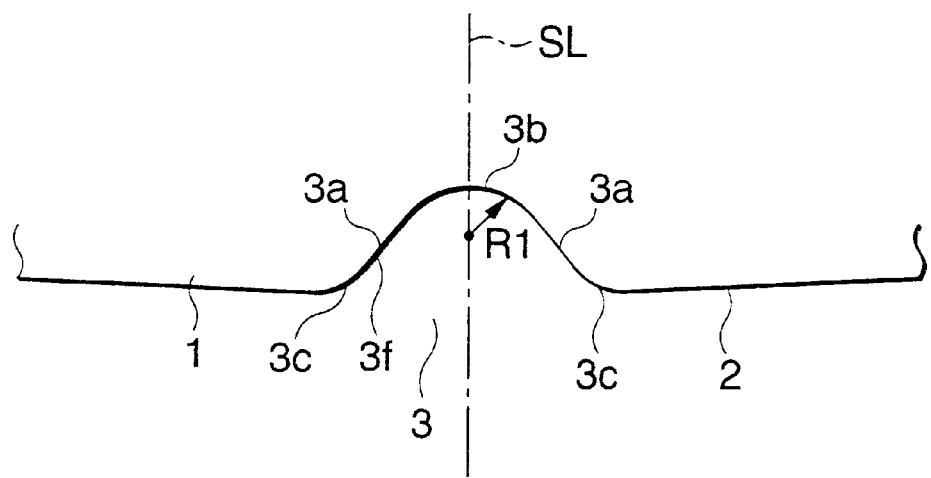
FIG. 2 is a plan view showing the shape of a notch groove of the wafer before chamfering is performed.

FIG. 1 is a plan view of a wafer which has been subjected to a previous process and which must be subjected to process for chamfering a notch groove by a method according to this embodiment. FIG. 2 shows the notch groove of the wafer.

A wafer 1 is formed into a flat plate shape which has parallel principal planes (i.e., has lower and upper surfaces in parallel with each other) and a center line passing through center OW and perpendicular to the drawing sheet on which FIG. 1 has been drawn. The peripheral side of the wafer 1 has a circular peripheral side portion 2, the center of which is the center line passing through the center OW. A notch groove 3 in the form of a V-shape is provided for a portion of the peripheral side portion 2.

In the first embodiment, the wafer 1 subjected to the previous process may be employed regardless of whether or not the finish of its principal plane and chamfering of the peripheral side portion 2 have been performed. The shape of notch groove 3 is not restricted to the V-shape. A edge surface/peripheral side surface 3f of the notch groove 3 as shown in FIG. 2 is formed perpendicular to the principal plane in the previous process.

As shown in FIG. 2, the notch groove 3 comprises straight portions 3a which are cut to be formed a V-shape together, a groove bottom 3b for smoothly connecting the two straight portions 3a to each other and orifices 3c enabling the notch groove 3 to smoothly be connected with the peripheral side portion 2. Each of the groove bottom 3b and the orifices 3c is formed into a circular arc which is projection arc in opposition direction each other. The groove bottom 3b may be formed into a concave curve facing outwards when it is viewed from the wafer 1. The orifices 3c may be formed into a convex curve facing outwards when it is viewed from the wafer 1.

Figure 3:
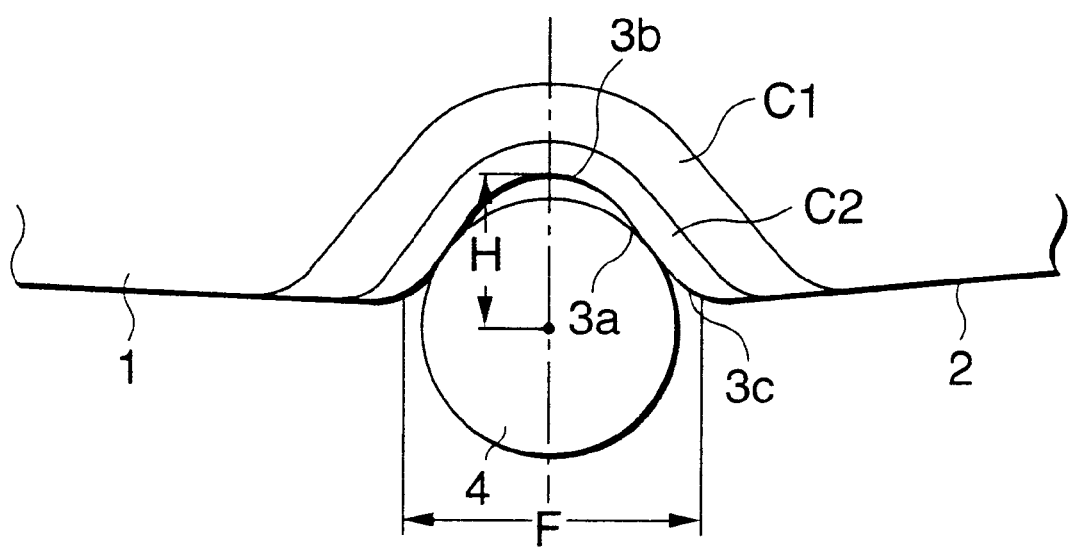
FIG. 3 is a plan view showing the shape of the notch groove of the wafer after chamfering is performed.

A pin 4 for deciding a location has a cylindrical shape and comes in contact with the straight portions 3a as shown in FIG. 3 drawing the chamfered wafer 1.

Note that the edges of the edge surface 3f of the notch groove 3 are receded and chamferings C1, C2, C3 are formed owing to chamfering in a state shown in FIG. 3 as compared with a state shown in FIG. 2

After the chamfering process has been completed, the width F between the two orifices 3c is 3 mm and the depth H of the notch groove 3 is 1 mm to 1.5 mm as shown in FIG. 3.

Figure 4:
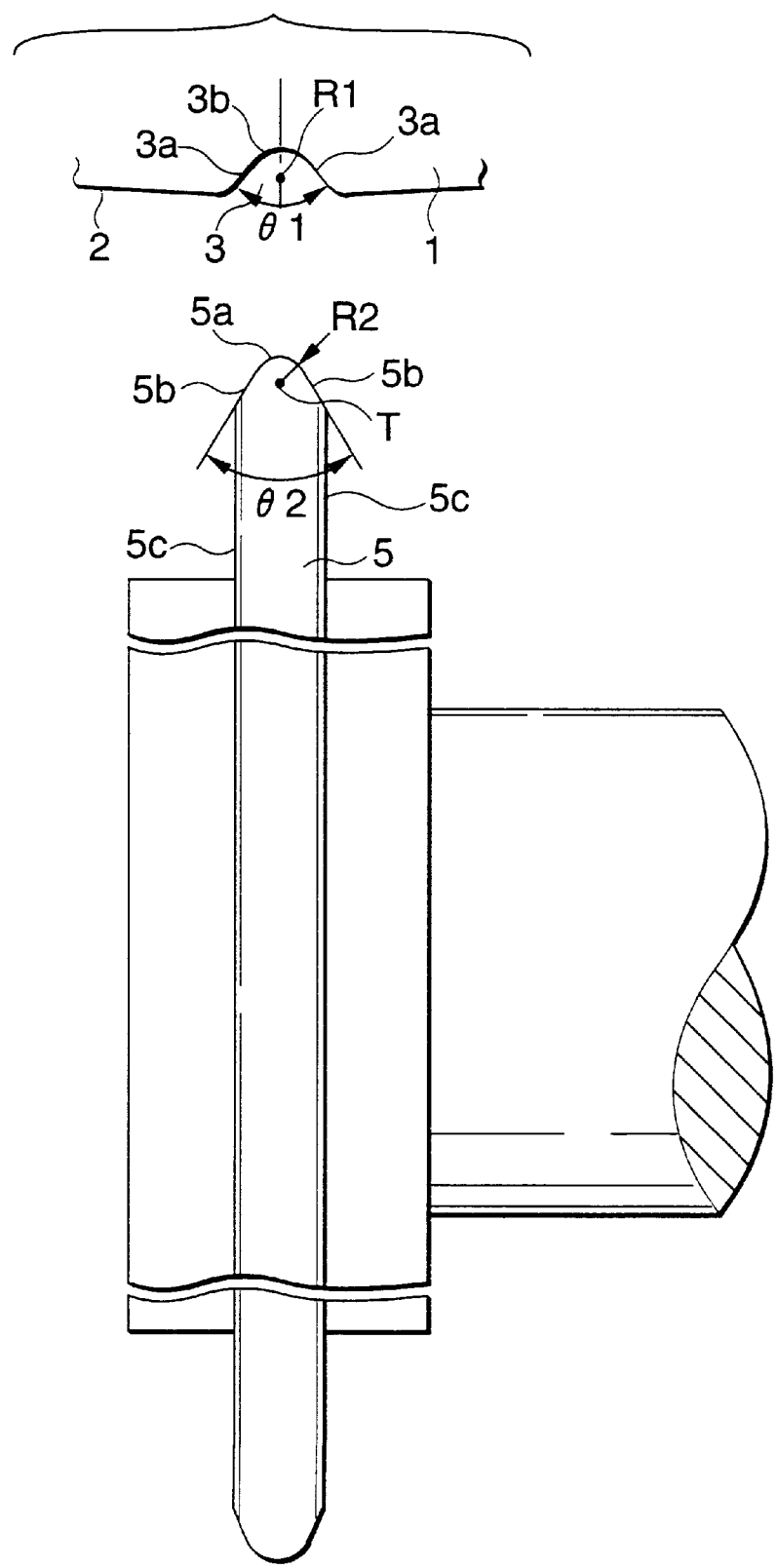
FIG. 4 is a plan view showing the relationship between the wafer and a grindstone.

FIG. 4 shows a positional relationship among the wafer and the grindstone, and the shape of the grindstone. The groove bottom 3b of the notch groove 3 of the wafer 1 subjected to a previous/precedence process is formed into a circular arc having a radius R1 in this embodiment. The grindstone 5 is formed into a disc shape and has a circular-arc portion 5a and straight portions 5b. A bus line of the peripheral side of the grinding portion of the grindstone is defined by combination of the circular-arc portion 5a at its peripheral side and the straight portion 5b and a body portion. The circular-arc portion 5a is formed as a grinding portion with which the notch groove is chamfered. The straight portions 5b are provided for gradually and smoothly enlarging the width of the grindstone toward the center from the circular-arc portion 5a. Moreover, smooth connection is established from the straight portions 5b to the body portions 5c as flat plates disposed in parallel with each other. The circular-arc portion 5a serves as a grinding surface having a radius R2 which is smaller than the radius R1 of the groove bottom 3b of the notch groove 3. The angle θ2 made by the two straight portions 5b is smaller than the angle θ1 made by the straight portions 3a of the notch groove 3.

The radius R1 of the groove bottom 3b of the notch groove 3 must be 0.9 mm or larger.

The center line of rotation of the grindstone 5 and the center line of the wafer 1 intersect (i.e., separately cross) each other while they are not in the same plane, that is, they are skew lines. In other words, the rotational center line of the grindstone 5 is situated at a torsional position with respect to the center axis of the wafer 1. (Here, "torsional position" means a physical relation which lies in a direction at an angle of stagger to the direction of the center axis of the wafer 1 but does not cross the center axis of the wafer 1).

In this embodiment, the angle of stagger/intersection is 90°.

(Wafer used for Chamfering Notch Groove, and Means for Relatively Moving Grindstone and Means for Rotating Wafer)

Figure 5:
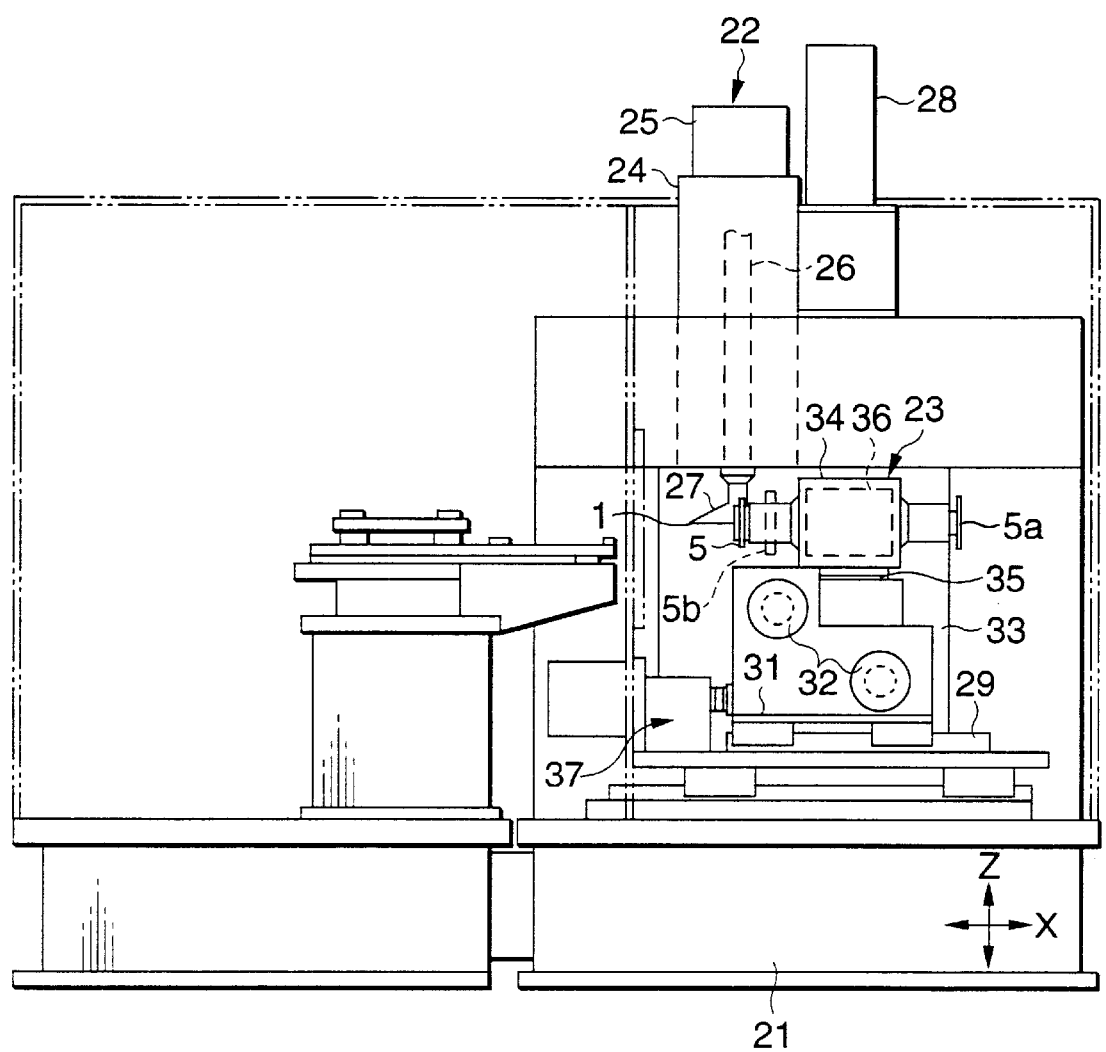
FIG. 5 is a front view showing an apparatus for chamfering the notch groove of the wafer.

As shown in FIG. 5, in an apparatus for chamfering the wafer according to this embodiment, a wafer sucking mechanism 22 and a chamfering and grinding mechanism 23 are disposed on a frame 21. The wafer sucking mechanism 22 sucks and holds the wafer 1 and the chamfering and grinding mechanism 23 grinds the peripheral side edge of the wafer 1 hich is sucked and held by the wafer sucking mechanism 22.

As shown in FIG. 5, in the wafer sucking mechanism 22, a guide cylinder 24 is attached to the frame 21 in such a manner that the guide cylinder 24 can elongate vertically (in the Z-axis). In the guide cylinder 24, a support cylinder 25 is supported to be movable in the direction of the Z-axis. A support shaft 26 elongated vertically is supported in the support cylinder 25 to be rotatable therein. A suction pad 27 is fixed to the lower end of the support shaft 26. When the support shaft 26 has been rotated by a motor (not shown), the suction pad 27 is rotated. The frame 21 has a Z-axis screw-feeding unit 28 for vertically moving the support shaft 26 to thereby vertically move the suction pad 27.

The structure of the chamfering and grinding mechanism 23 will now be described. A pair of X-axis guide rails 29 extending in the lateral direction (the direction of the X-axis) on the horizontal plane are laid on the frame 21 through a plate.

A movable frame 31 is movably supported on the X-axis guide rails 29. A pair of Y-axis guide rods 32 extending in the lengthwise direction (the direction of the Y-axis) in the horizontal plane are disposed above the movable frame 31. A saddle 33 is movably supported by the Y-axis guide rod 32. A grindstone frame 34 is supported in the upper portion of the saddle 33 through a vertical support shaft 35 in such a manner that the grindstone frame 34 can rotate around the vertical axis. The grindstone frame 34 includes a motor 36. Grindstones 5 and 5a, attached to both ends of the grindstone shaft which is situated at a torsional position with respect to a support shaft 26, are disposed on both sides (that is, right and left sides in FIG. 5) of the grindstone frame 34 to grind the peripheral side portion 2 or the notch groove 3 of the wafer 1. The grindstones 5 and Sa are attached to the motor shaft of the motor 36 as the grindstone shaft. In this embodiment, the shaft of the grindstone 5 is disposed in the horizontal direction and intersects the support shaft 26 to make a right angle. The grindstone 5 can be replaced with the other grindstone 5a by rotating the support shaft 35 by 180°.

However, although in this embodiment the grindstones 5 and 5a are respectively disposed on both sides of the grindstone frame 34 (that is at right and left sides thereof in FIG. 5), it is possible to modify the structure in such a manner that a pair of grindstones 5 and 5b are provided on only one side of the grindstone frame 34 (that is, in addition to the grindstone 5 a grindstone 5b is provided which is defined at the left side of the grindstone frame 34 with a dot line in FIG. 5 and is provided instead of the right-side grindstone frame 34). At this time, each of the grindstones 5 and 5b are placed so as not to interfere with the grinding operation of the other one.

An X-axis screw-feeding unit 37 is provided to feed the movable frame 31. A Y-axis screw-feeding unit (not shown) is provided for feeding the saddle 33. Each of the screw feeding units 28, 37 and the Y-axis screw-feeding unit has a servo motor which is controlled by a numerical control unit. Thus, a tool passage (the tool locus) or the position of the tool to be described later can be changed.

(Grinding of Notch Groove)

When the center of the grindstone 5 is center 0 (01 to 05), the grindstones 5 draws a locus of a tool on a plurality of planes which are in parallel with the principal plane of the wafer 1, as shown in FIG. 5 so as to form chamferings C1–C5. Such an operation is performed in such a manner that the X- and Y-axes of the grindstone 5 are controlled by the chamfering and grinding mechanism 23, while the wafer 1 is sucked to the suction pad 2 which is fixed thereto in non-rotative state as shown in FIG. 5. When the passages for the tools are represented by point T which is the center of the circular-arc portion 5a at the leading end of the peripheral side of the grindstone 5 and is near to the wafer 1 as shown in FIG. 4, the passages for tools are TP1 to TP5 shown in FIG. 7. The passages for the tools (loci of the tools) are not changed at the center (an intersection between a rotation center line of the grindstone, and a plane perpendicular to the rotation center line of the grindstone passing through the point T) of the grindstone 5. Therefore, the passage for the tool at the center of the grindstone 5 is used to describe this embodiment. With any one of the passages, TP1 to TP5 for the tools is able to continuously chamfer the orifices 3c, the straight portions 3a, the groove bottom 3b, and the opposite straight portions 3a and the opposite orifices 3c at opposite side with respect to the symmetrical center SL shown in FIG. 2. Moreover, tool passages TPA for performing air-cutting are disposed on each of the two sides of each passage for the tool respectively.

Figure 7:
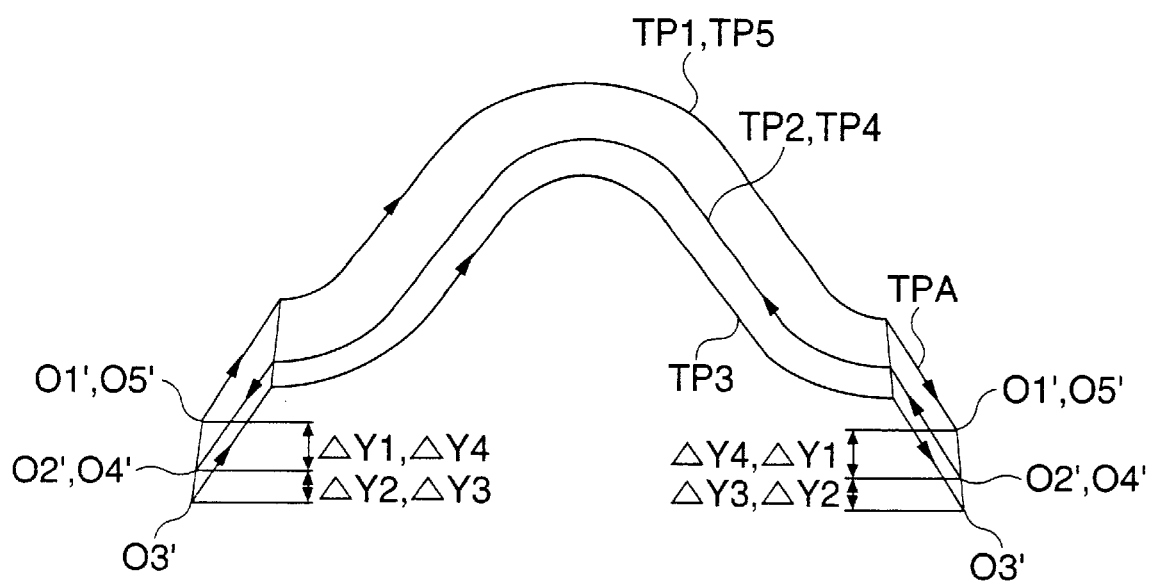
FIG. 7 is a plan view showing a locus of a tool.
Figure 8:
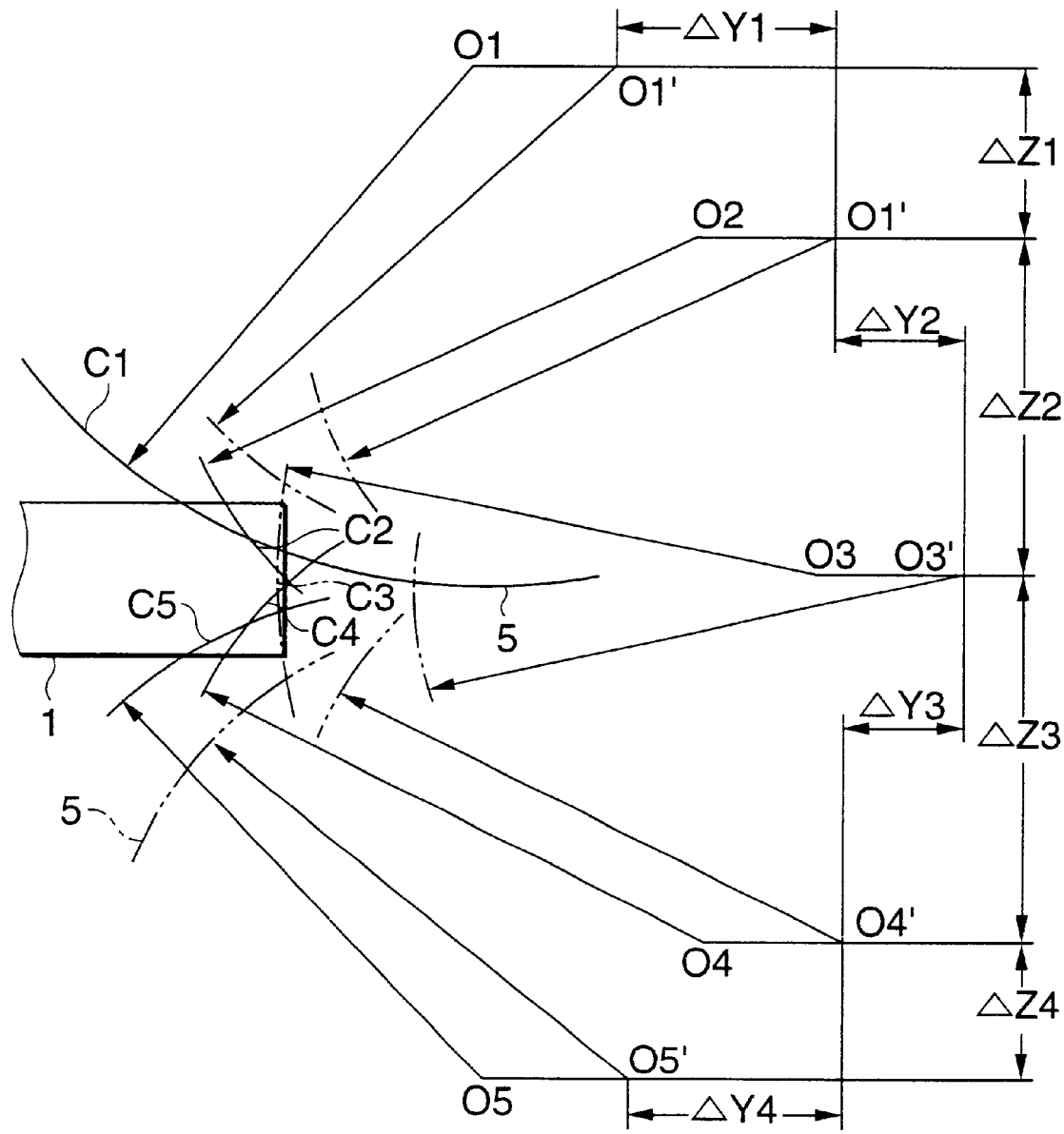
FIG. 8 is a vertical cross sectional view showing a tool passage.

The grindstones 5 and the wafer 1 are positioned apart from each other at the ends 01'-031'-05' (which are ends of the passage TPA for the tool)(see FIG. 7)as indicated with two-dot chain lines shown in FIG. 8. The ends 01'-03'-05' of the passage TPA of the tools corresponds to centers 01 to 05 of the grindstones.

(Chamfering Method)

The chamfering method will now be described. When the X- and Y-axes are controlled to align the center of the grindstone 5 to any one of the end sides of the tool passage TP1, for example, the left end 01' shown in FIG. 7, the grindstone center 01 is at a position corresponding to the position at which chamfering C1 is formed, as shown in FIG. 9.

Figure 9:
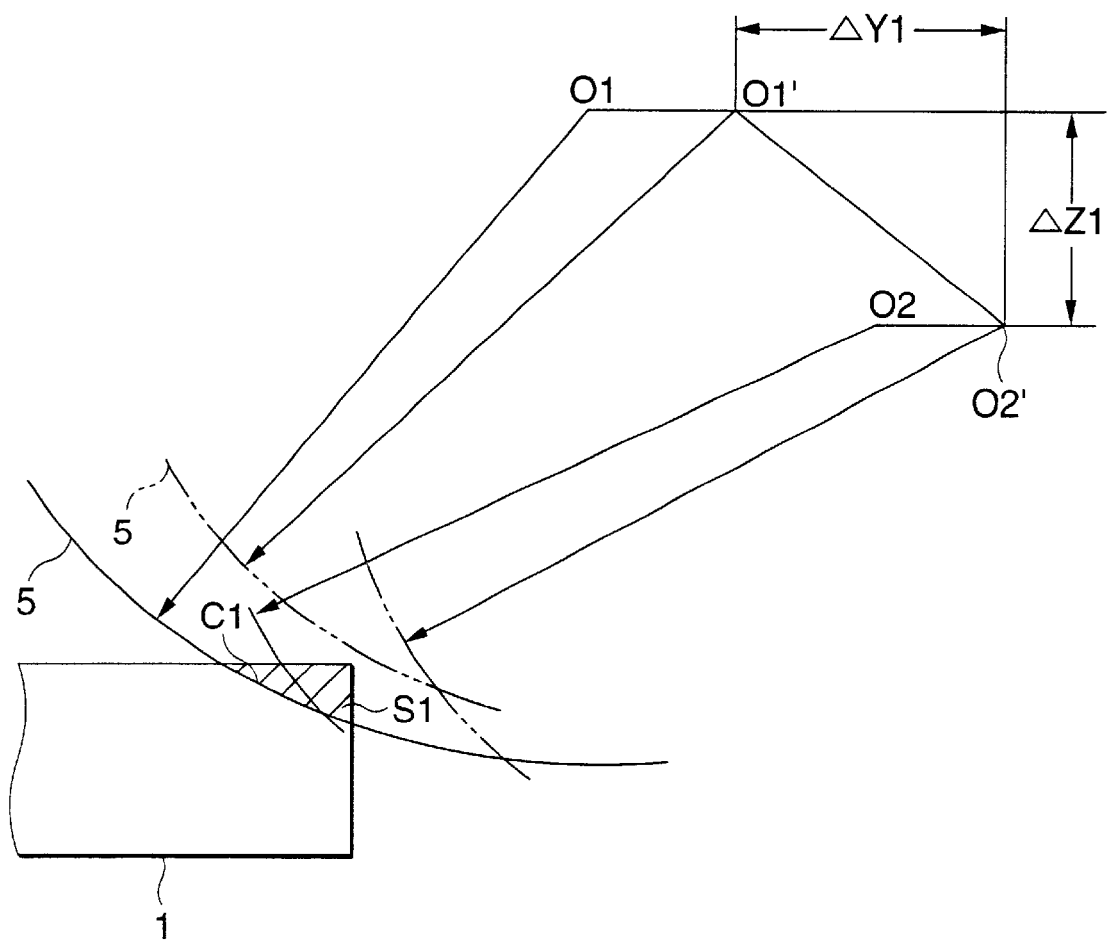
FIG. 9 is a vertical cross sectional view showing a chamfering process.

When the X- and Y-axes are controlled to feed the grindstone 5 to the right along the tool passage TP1 as indicated with an arrow shown in FIG. 7, stock S1 in the cross-line portion shown in FIG. 9 is removed along the edge of the notch groove 3 passing through air-cut tool passage TPA of left side. Thus, chamfering C1 is formed. Next, when the grindstone center enters air-cut tool passage TPA of right side and the grindstone center reaches the end 01' of right side shown in FIG. 7, the grindstone 5 is positioned apart from the wafer 1 as indicated with two-dot chain line shown in FIG. 9. Then, the Y-axis and the Z-axis are controlled so that the wafer 1 is moved upwards and the grindstone frame 34 is retracted. The amount of the upward movement of the wafer 1 is, as shown in FIG. 9, the Z-directional difference DZ1 between the grindstone center 01 and 02 or between 01' and 02'. The amount of retraction of the grindstone frame 34 is the Y-directional difference DY1 between the tool passages TP1 and TP2 each of is shown in FIG. 7 showing a plan view.

Figure 10:
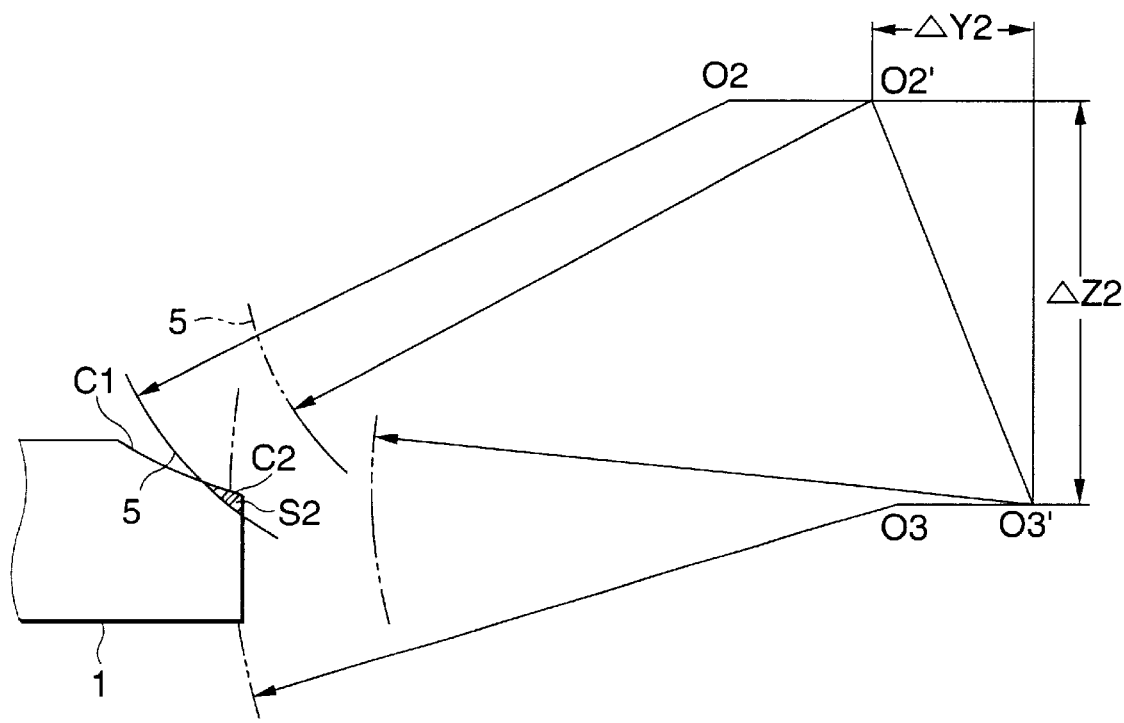
FIG. 10 is a vertical cross sectional view showing the chamfering process.

When the X- and Y-axes are controlled to feed the grindstone 5 to the left along the tool passage TP2 as indicate with an arrow shown in FIG. 7, cross line stock S2 shown in FIG. 10 is removed along the edge of the notch groove 3. Thus, chamfering C2 is formed. Next, when the grindstone center has reached to the end 02' of the left side shown in FIG. 7, the grindstone 5 is positioned apart from the wafer 1 as indicated with a two-dot chain line shown in FIG. 10. Then, the Y-axis are controlled to upwards move the wafer 1, and the grindstone frame 34 is retracted. The amount of the upward movement of the wafer 1 is, as shown in FIG. 10, the z-directional difference $\Delta Z2$ between the grindstone center 02 and 03 or between 02' and 03'. The amount of retraction of the grindstone frame 34 is the Y-directional difference $\Delta Y2$ between the tool passages TP2 and TP3 each of which is shown in FIG. 7, showing a plan view.

Figure 11:
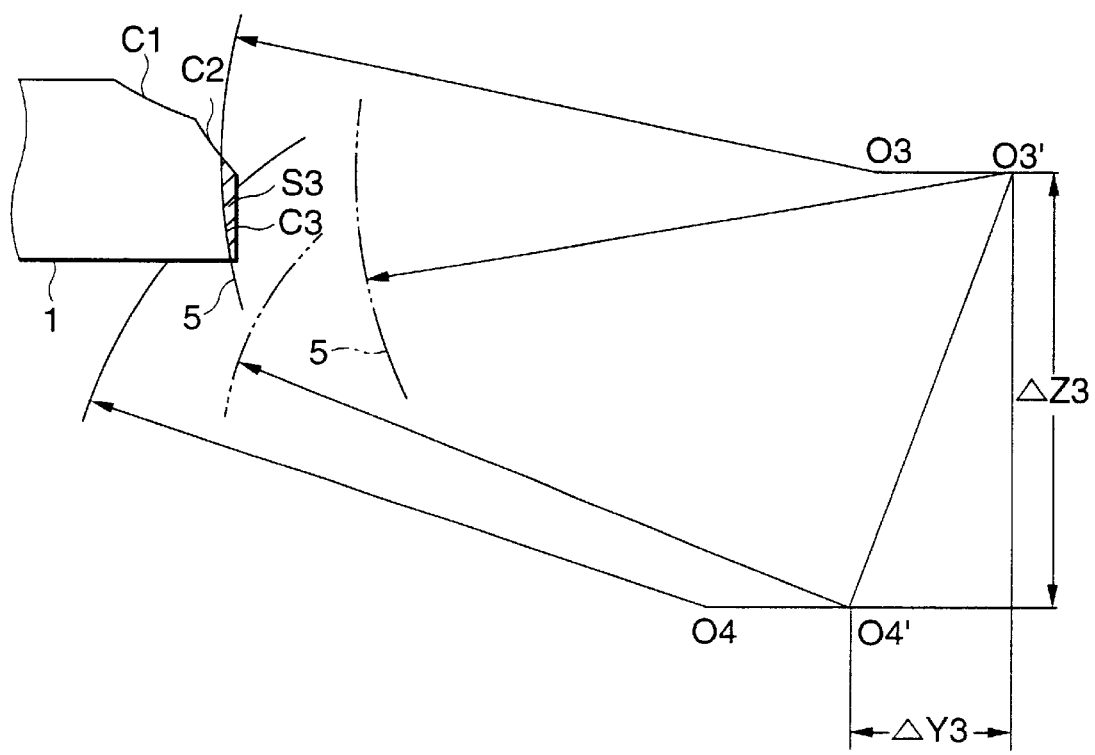
FIG. 11 is a vertical cross sectional view showing the chamfering process.

When the X- and Y-axes are controlled to move the grindstone 5 to the right along the tool passage TP3 as indicated with an arrow shown in FIG. 7, cross line stock S3 shown in FIG. 11 is removed along the edge of the notch groove 3. Thus, chamfering C3 is formed. The chamfering C3 is substantially the same as the cylindrical surface, the center line of which is the center line of the wafer 1. When the grindstone center has reached the end 03' of the right side shown in FIG. 7, the grindstone 5 is positioned apart from the wafer 1 as indicated with a two-dot chain line shown in FIG. 11. Thus, the center is positioned at 03'. Then, the Y-axis and Z-axis are controlled to upwards move the wafer 1 and the grindstone frame 34 is moved forwards. The amount of the upward movement of the wafer 1 is, as shown in FIG. 11, the Z-directional difference ΔZ3 between the grindstone center 03 and 04 or between 03' and 04'. The amount of forward movement of the grindstone frame 34 is the Y-directional difference ΔY3 between the tool passages TP2 and TP3 each of which is shown in FIG. 7 showing a plan view.

Figure 12:
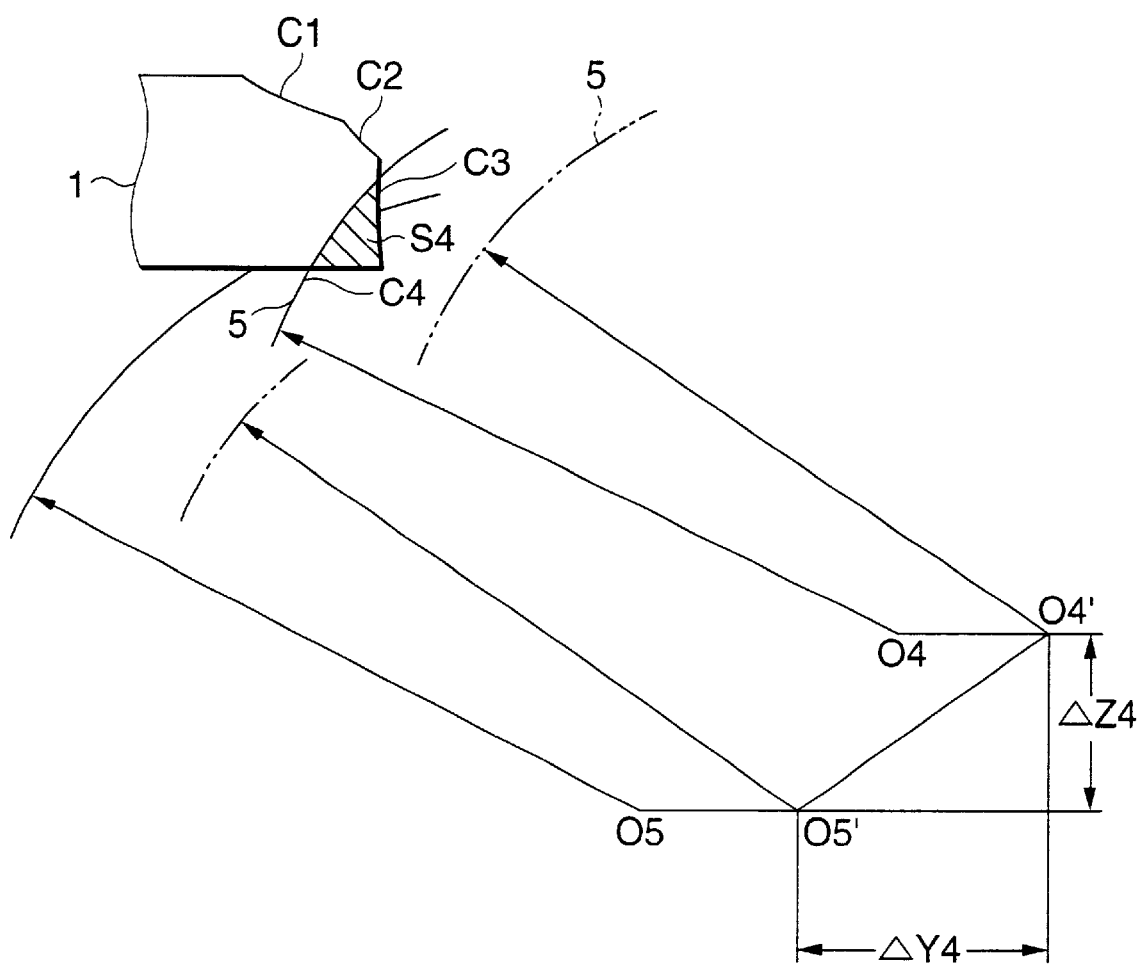
FIG. 12 a vertical cross sectional view showing the chamfering process.

When the X- and Y-axes are controlled to move the grindstone 5 to the left along the tool passage TP4 as indicated with an arrow shown. in FIG. 7, cross line stock S4 shown in FIG. 12 is removed along the edge of the notch groove 3. Thus, chamfering C4 is formed. Next, when the grindstone center has reached the end 03' of left side shown in FIG. 7, the center of the grindstone 5 is positioned at 04' as indicated with a two-dot chain line shown in FIG. 12. Then, the Y-axis and Z-axis are controlled to upwards move the wafer 1 and the grindstone frame 34 is moved forwards. The amount of the upward movement of the wafer 1 is, as shown in FIG. 12, the Z-directional difference ΔZ4 between the grindstone center 04 and 05 or between 04' and 05'. The amount of forward movement of the grindstone frame 34 is the Y-directional difference ΔY4 between the tool passages TP4 and TP5 each of which is shown in FIG. 7 showing a plan view.

Figure 13:
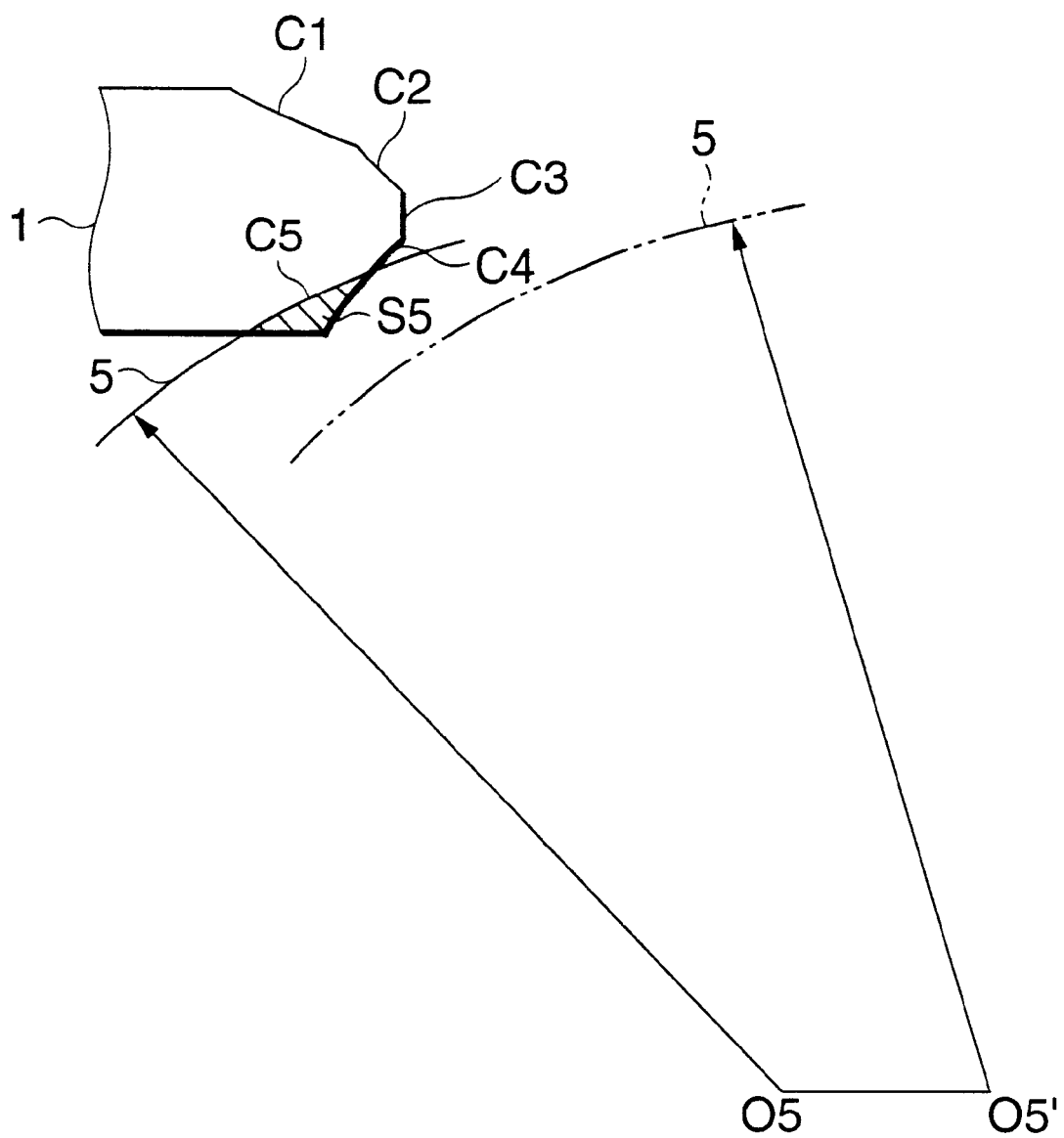
FIG. 13 is a vertical cross sectional view showing the chamfering process.

When the X- and Y-axes are controlled to move the grindstone 5 to the right along the tool passage TP5 as indicated with an arrow shown in FIG. 7, cross line stock S5 shown in FIG. 13 is removed along the edge of the notch groove 3. Thus, chamfering C5 is formed. Next, when the grindstone center has reached the end 05' of right side shown in FIG. 7, the center of the grindstone 5 is positioned at 05' as indicated with a two-dot chain line shown in FIG. 13. Then, the Y-axis and Z-axis are controlled to upwards move the wafer 1 and the grindstone frame 34 is moved forwards. The upward movement of the wafer 1 is continued until the wafer 1 reaches a position at which the wafer 1 can be changed. FIG. 8 shows the above-mentioned tool passages in chamfering process.

The method of chamfering the notch groove according to this embodiment results in chamfering in the form of a polygonal shape. In this embodiment, the chamfering is performed to form a pentagonal shape and symmetrical shape. In the estimation, the longest distance between a curve, which comes in contact with each sides of each of chamfering C1 to C5 obtained by cutting with a plane perpendicular to the edge of the notch groove 3, and the edge of each of chamfering C1 to C5 is 12 $\mu$m. When nonagonal chamfering is formed, the longest distance between a curve, which comes in contact with the side of each of chamfering C1 to C9, and the edge of each of chamfering C1 and C9 is 2 $\mu$m. Therefore, time required to round the edge by performing chamfering which is polishing, such as buffing, which is performed as a posterior process is about one minute in this embodiment. Hence it follows that time required to complete the posterior process can considerably be shortened as compared with the conventional method.

Note that it is preferable to make the number of the surfaces constituting the polygonal chamfering configuration nine or more, because the posterior process can be made easier and as increasing the number of the surfaces.

The apparatus and method according to this embodiment enables a grinding conditions of a mirror-surface polishing/finishing process to be obtained, by using a resinoid-bond grindstone. Therefore, surface roughness Rmax of about 0.1 $\mu$m can be realized. Thus, occurrence of chipping and cracking can be prevented. since a grindstone having a large diameter can be used, the shape of the surface which is ground by the grindstone can relatively easily be maintained if a soft grindstone is used which is required to realize the mirror-surface polishing/finishing process.

Note that in the conventional technique utilizing the formed grindstone, it has been only possible to have a surface roughness of the ground surface higher than 1 $\mu$m, whereas with the present invention a wafer having the chamfered surface the surface roughness of which is less than 1 $\mu$m can be realized. Further, although it is possible to realize surface roughness Rmax of about 0.1 $\mu$m with the present invention if needed, the surface roughness less than 0.5 $\mu$m is preferable and 0.2 $\mu$m is more preferable in view of a difference of the grindstone to be used.

(Grinding Conditions)

The above-mentioned grinding conditions are, for example, as follows:

Grindstone
- diameter of grindstone (diameter): 100 mm
- grinding speed using grindstone; 2000 m/min
- grinding particles: type: diamond particle size #3000
- bond: type: resinoid Grindstone feeding speed along tool passage: 50 mm/min The above-mentioned tool passage indicates an example. An order as chamfering C1→C5→C4→C2→C3 may be employed. Although cutting is performed one time in the above-mentioned embodiments, cutting may be performed several times. Although the tool passages TP1, TP5 and TP2, TP4 and TP3 are the same, the tool passages TP1, TP5 and TP2, TP4 and TP3 are made to be different from each other so that the chamfered shape is made so as to be the same regardless of the position.

Figure 17:
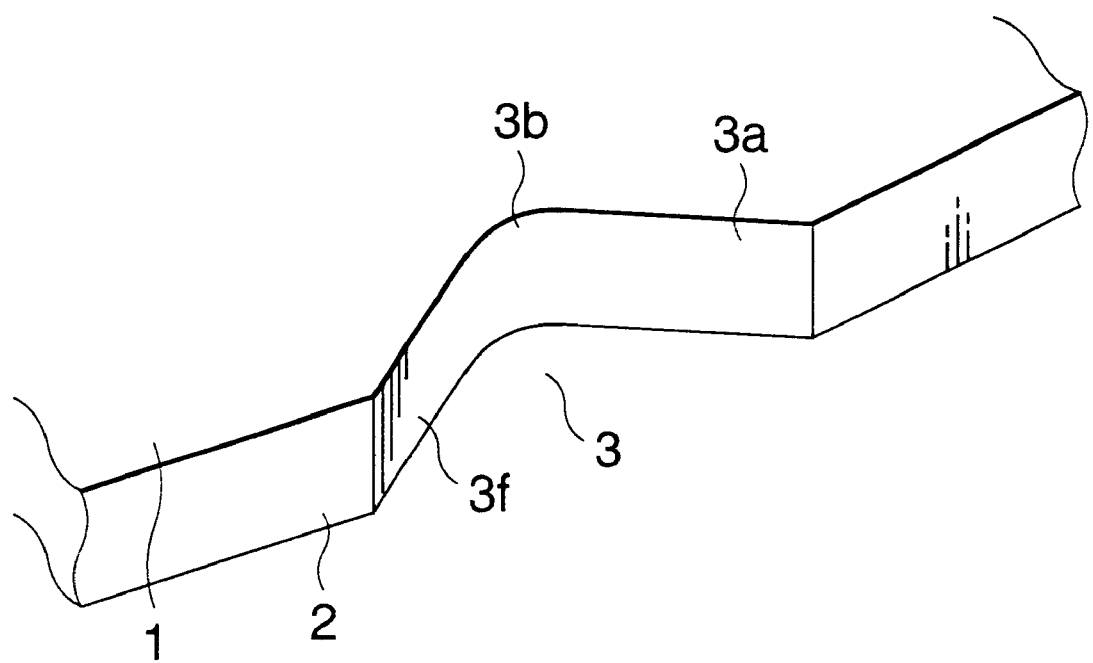
FIG. 17 is a perspective view showing the wafer having the notch groove before chamfering is performed.
Figure 18:
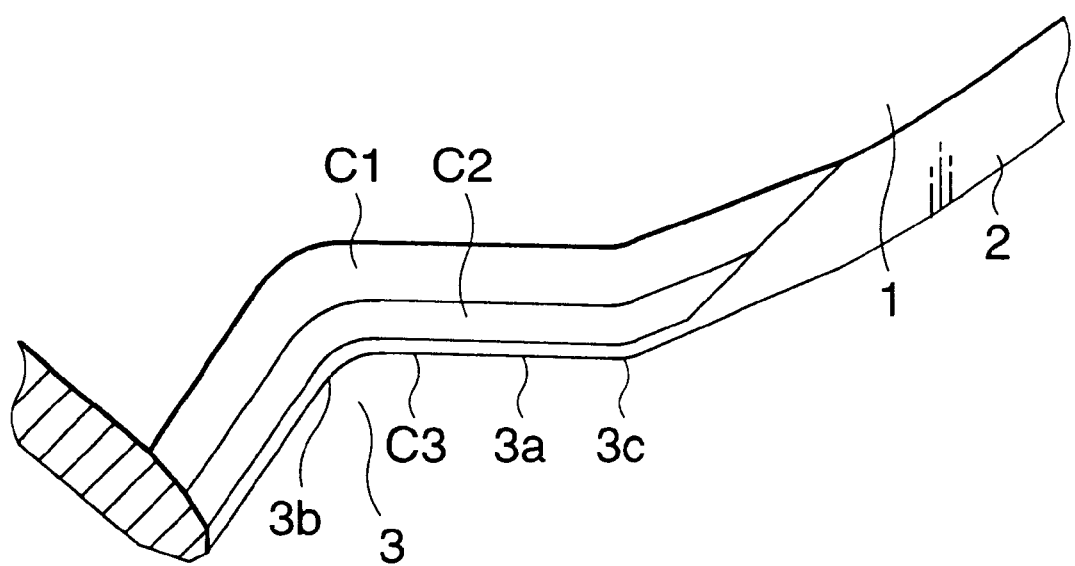
FIG. 18 is a perspective view showing the wafer having the notch groove after chamfering is performed.

In this embodiment, the tool passages are obtained by controlling the X- and Y-axes. An encoder may be provided for the support shaft 26 to relate the rotation of the wafer 1 and the Y-axis feeding of the grindstone 5 to each other to obtain the tool passages. To obtain the tool passages, a cam mechanism may be employed. FIG. 17 is a perspective view showing the wafer before chamfering. FIG. 18 is a perspective view showing the notch groove of the wafer after the above-mentioned chamfering process.

Second Embodiment

The second embodiment is arranged to chamfer both of the notch groove and the peripheral side surface as well as the notch groove of the wafer according to the first embodiment.

The base which must be ground and the apparatus are similar to those according to the above-mentioned first embodiment. Therefore, only different structures will now be described.

Figure 6:
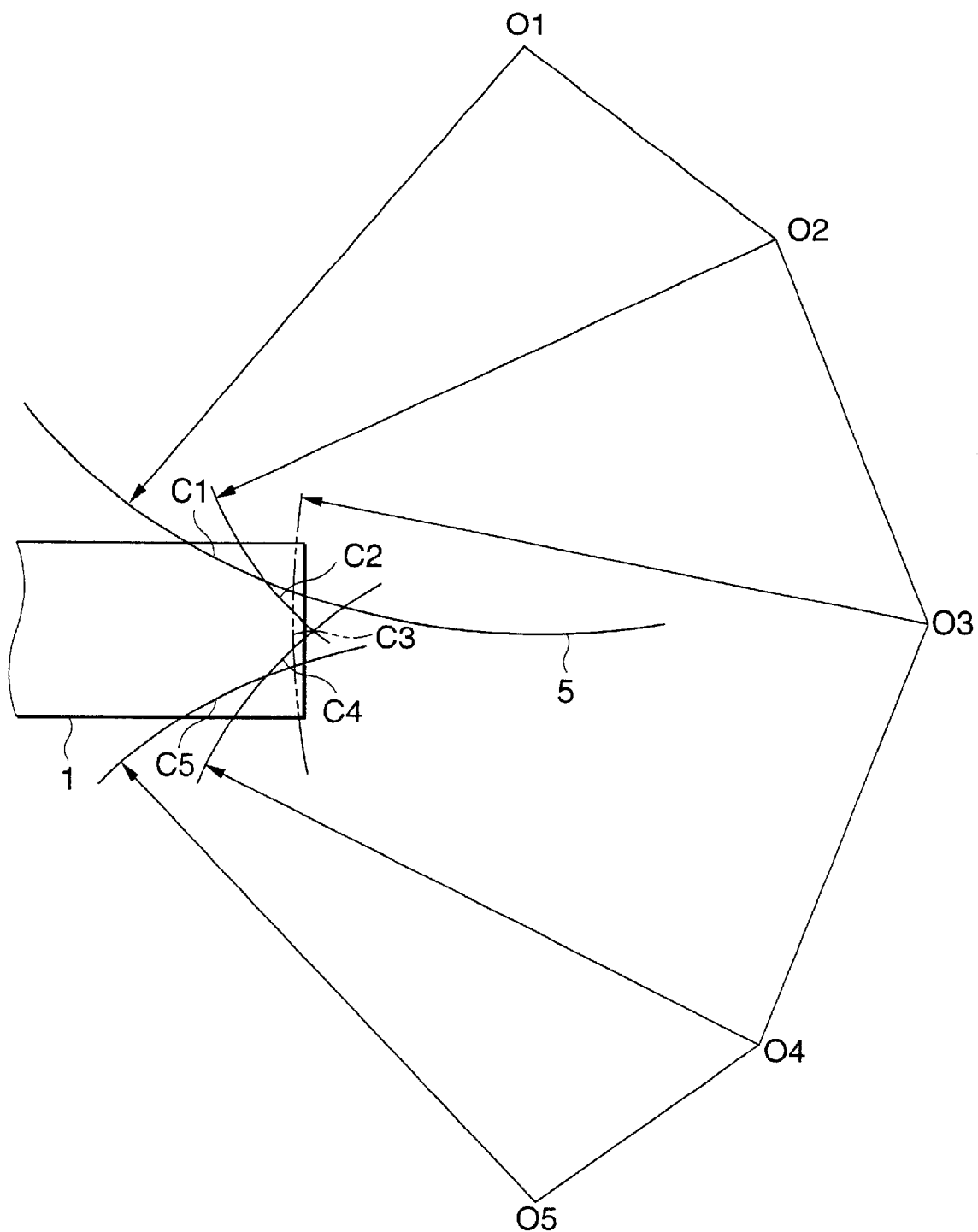
FIG. 6 is a cross sectional view showing a chamfered shape of the notch groove of the wafer.
Figure 14:
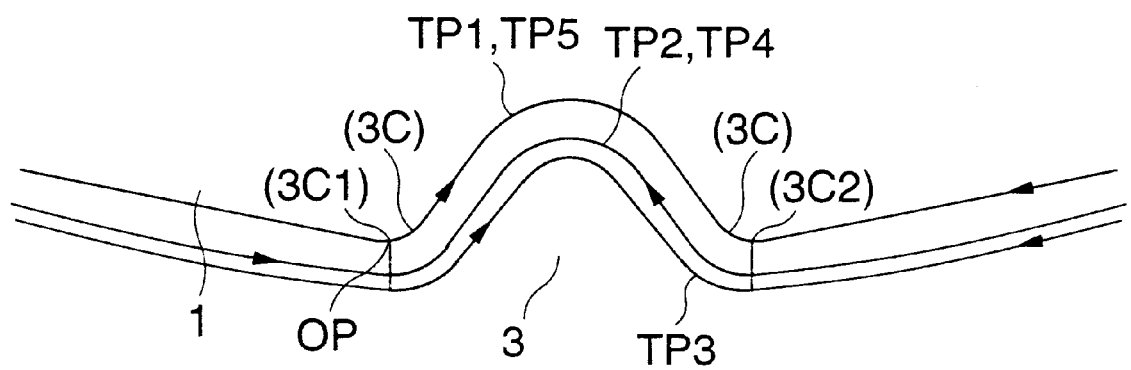
FIG. 14 is a plan view showing the locus of the tool in continuous chamfering process of the notch groove and the peripheral side surface of the wafer.
Figure 15:
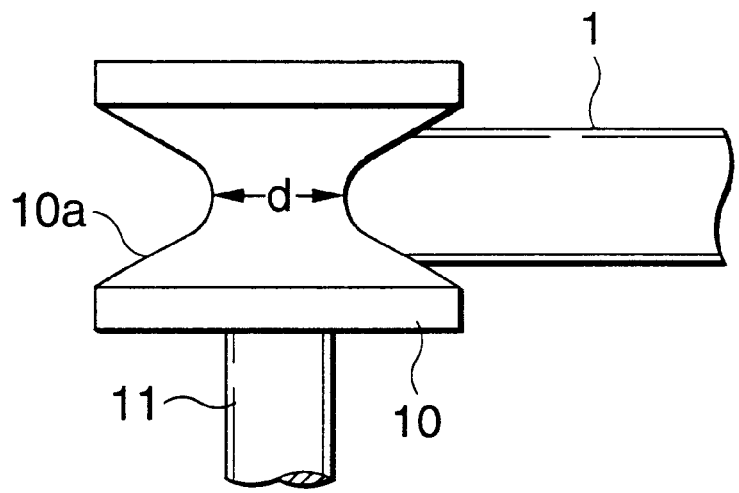
FIG. 15 is a vertical cross sectional view showing a conventional grindstone for chamfering the notch groove of the wafer.
Figure 16:
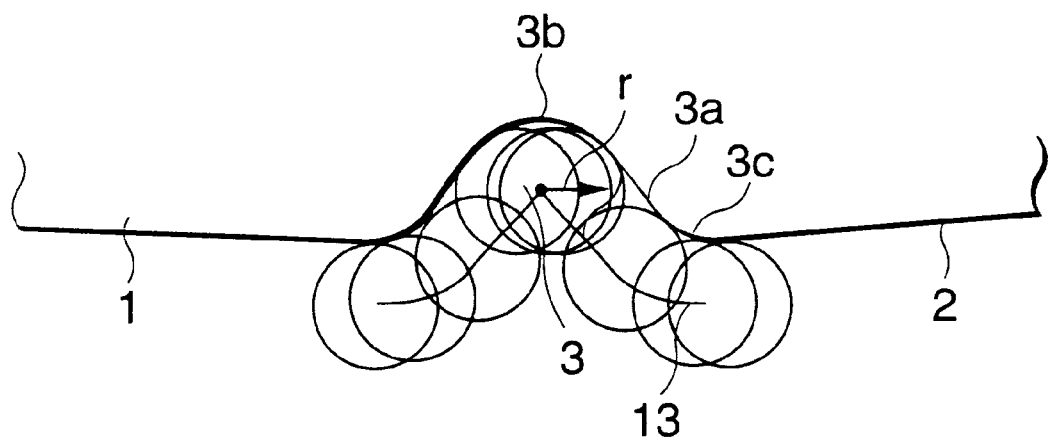
FIG. 16 is a plan view showing a conventional method of chamfering the notch groove.

In second embodiment, the peripheral side portion 2 of the wafer 1 is continuously chamfered such that the same chamfered shapes as those indicated with symbols C1 to C5 shown in FIG. 6 (the same symbols C1 to C5 of chamfering of the notch groove 3) are used. As for the chamfering, the portion which is the air-cut TPA shown in FIG. 7 is free from passing of the grindstone 5. As shown in the tool passage shown in FIG. 14, the X- and Y-axes are controlled to move the grindstone center from the position corresponding to the start 3c1 of the orifice 3c of the notch groove 3 (in FIG. 14, the symbol of the chamfered portion is parenthesized), ie., original point OP along the tool passage TP1 as indicated with an arrow. Thus, chamfering C1 is formed. Next, feeding of the grindstone 5 is stopped at the start 3c2 of the other orifice 3c and then the support shaft 26 is operated to clockwise rotate the wafer 1. Thus, also chamfering C1 is provided for the peripheral side portion 2 of the wafer 1. When the wafer 1 has been moved to the start 3c1 of the orifice 3c of left side with respect to the grinding surface of the grindstone 5, retracting of the grindstone 5 in the direction of the Y-axis is started. When the wafer 1 is furthermore rotated from the start 3c1 of the orifice 3c, the grindstone 5 is moved to a position corresponding to another start 3c2 of the orifice 3c of the notch groove 3. At this portion, rotation of the wafer 1 is stopped.

Then, the center of the grindstone 5 is moved to a position corresponding to the tool passage TP2 and the grindstone 5 is moved to the left along the tool passage TP2 so that chamfering c2 of the notch groove 3 is performed. Then, feeding of the grindstone 5 is stopped at the start 3c1 of the orifice 3c. Then,the wafer 1 is counterclockwise rotated by 360° in a state shown in FIG. 14 so that chamfering C2 is provided for the peripheral side portion 2 of the wafer 1 in a region from starts 3c1 of the orifice 3c to the start 3c2. Thus, the grindstone 5 is retracted while passing through the notch groove 3 from the start 3c2 to the start 3c1 of the orifice 3c in an air cut manner.

When the grinding surface has coincided with the start 3c1 of the left-hand orifice 3c, that is, when the wafer 1 has been rotated by 360° after chamfering C2 of the notch groove 3 has been completed, the grinding surface is again brought to the start 3c1 of the orifice 3a. Then, the wafer 1 is stopped and the grindstone 5 is retracted to move the grindstone center such that the grinding surface is moved to a position corresponding to the chamfering C3. Then, chamfering C3 of the notch groove 3 is formed corresponding to the tool passage TP3. Then, feeding of the grindstone 5 is stopped at the start 3c2 of the orifice 3c. Then, the wafer 1 is clockwise rotated in a state shown in FIG. 14 to provide chamfering C3 for the peripheral side portion 2 of the wafer 1. Chamfering C3 is completed in a portion in which the wafer 1 coincides with the grinding surface and the start 3c1 of the orifice 3c.

Then, a similar process is performed to contiguously provide chamfering C4 and C5 for the notch groove 3 and the peripheral side portion 2. The above-mentioned method for grinding both of the peripheral side surface and the notch groove indicates an example. If the peripheral side surface can be ground continuously from grinding of the notch groove, other tool passages may be employed.

In the second embodiment, the notch groove 3 is chamfered such that the wafer 1 is stopped when the grindstone 5 is moved. The wafer 1 may always be rotated while the grindstone 5 is moved forwards/rearwards in the direction of the Y-axis when the notch groove 3 is chamfered and feeding of the grindstone 5 may be stopped when the peripheral side portion 2 is chamfered.

Although the above-mentioned embodiments are structured such that the wafer support shaft and the shaft of the grindstone are intersected at right angle and in different planes respectively, the angle of intersection is not limited to the right angle.

According to the above-mentioned a wafer and a method of chamfering a notch groove of a wafer according to present invention, (1) Since the grindstone having the large diameter can be used, the lifetime of the grindstone can significantly be elongated.

(2) Notch grooves having the same shape/predetermined shape can always be formed by controlling the outer diameter of the grindstone regardless of curvature radius of the leading end of grindstone, if the cross sectional shape of the leading end of grindstone, which is taken along a plane including the center axis of the grindstone shaft, has a size such that the cross sectional shape thereof can contact with the bottom of the notch groove of the wafer.

(3) Since the problem of deformation of the formed grindstone (having a small diameter) adaptable to the cross sectional shape of chamfering does not arise, the lifetime of the grindstone can be elongated and the cross sectional shape of chamfering can always be obtained stably.

(4) The conditions under which grinding is performed to realize required surface roughness of the chamfered portion are not severe as compared with the conditions of grinding required when a formed grindstone (having a small diameter) is employed. Therefore, chamfering finishing by a mirror-surface polishing/finishing process can be performed.

(5) A chamfering of the peripheral side surface of the wafer can be also performed by grinding continually after chamfering of the notch groove.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

What is claimed is:

1. A chamfering apparatus for a wafer with a notch groove comprising:

a holder for rotatably holding a wafer with a notch groove;

a grindstone frame rotatably supporting a disc shaped grindstone capable of grinding a surface with a surface roughness of Rmax 0.5 μm or less, said grindstone having a peripheral side surface at a leading end in its radial direction which has a curvature radius in a cross-section smaller than a minimum curvature radius of said notch groove, said cross section obtained by cutting with a plane containing the center axis of the grindstone, said central line of said wafer and the central line of said grindstone defining a skew line relationship;

a moving member capable of moving said grindstone relative to said wafer along said notch groove of said wafer on a parallel-extending plane which is in parallel with the principal plane of said wafer and relatively moving at least one of said wafer and said grindstone so as to move said grindstone relative to said wafer substantially along the chamfering shape of said wafer on an intersecting plane intersecting said parallel-extending plane at a predetermined angle; and a controller controlling the relative movements between said wafer and said grindstone on the parallel-extending plane and the intersecting plane, wherein said controller causes said grind stone to act on said notch groove while moving said grindstone relative to said wafer in such a manner that a contact position therebetween is moved along said notch groove while a first tool moving locus is drawn on a first parallel plane which is in parallel with said principal plane of said wafer, to thereby perform chamfering a first chamfered portion along said notch groove;

relatively moves said grindstone and said wafer in such a manner that the contact position therebetween is moved in accordance with a chamfered shape of said notch groove so as to allow said contact position to correspond to a second chamfered portion of said notch groove awhile a second tool moving locus is drawn on a first intersecting plane intersecting said parallel-extending plane at the predetermined angle, said second chamfered portion being substantially different from said first chamfered portion thus chamfered;

causes said grindstone to act on said notch groove while moving said grindstone relative to said wafer in such a manner that the contact position therebetween is moved along said notch groove while a third tool moving locus is drawn on a second parallel plane which is in parallel with said principal plane of said wafer and is different from said first parallel plane, to thereby perform chamfering the second chamfered portion along said notch groove;

relatively moves said grindstone and said wafer in such a manner that the contact position therebetween is moved in accordance with the chamfered shape of said notch groove so as to allow said contact position to correspond to a third chamfered portion of said notch groove while a fourth tool moving locus is drawn on a second intersecting plane intersecting said parallel-extending plane at the predetermined angle, said third chamfered portion being substantially different from said first and second chamfered portions thus chamfered; and causes said grindstone to act on said notch groove while moving said grindstone relative to said wafer in such a manner that the contact position therebetween is moved along said notch groove while a fifth tool moving locus is drawn on a third parallel plane which is in parallel with said principal plane of said wafer and is different from said first and second parallel planes, to thereby perform chamfering the third chamfered portion along said notch groove, relatively moves said grindstone and said wafer in such a manner that the contact position therebetween is moved in accordance with the chamfered shape of said notch groove so as to allow said contact position to correspond to a fourth chamfered portion of said notch groove while a sixth tool moving locus is drawn on a third intersecting plane intersecting said parallel-extending plane at the predetermined angle, said fourth chamfered portion being substantially different from said first, second and third chamfered portions thus chamfered; and causes said grindstone to act on said notch groove while moving said grindstone relative to said wafer in such a manner that the contact position therebetween is moved along said notch groove while a seventh tool moving locus is drawn on a fourth parallel plane which is in parallel with said principal plane of said wafer and is different from said first, second and third parallel planes, to thereby perform chamfering the fourth chamfered portion along said notch groove;

relatively moves said grindstone and said wafer in such a manner that the contact position therebetween is moved in accordance with the chamfered shape of said notch groove so as to allow said contact position to correspond to a fifth chamfered portion of said notch groove while an eighth tool moving locus is drawn on a fourth intersecting plane intersecting said parallel-extending plane at the predetermined angle, said fifth chamfered portion being substantially different from said first, second, third and fourth chamfered portions thus chamfered; and causes said grindstone to act on said notch groove while moving said grindstone relative to said wafer in such a manner that the contact position therebetween is moved along said notch groove while a ninth tool moving locus is drawn on a fifth parallel plane which is in parallel with said principal plane of said wafer and is different from said first, second, third and fourth parallel planes, to thereby perform chamfering the fifth chamfered portion along said notch groove, thereby chamfering said notch groove into a polygonal shape having at least five surfaces.

2. The chamfering apparatus according to claim 1, wherein said first intersecting plane is different from said second intersecting plane.

3. The chamfering apparatus according to claim 1, wherein the predetermined angle is about 90 degrees.

4. The chamfering apparatus according to claim 1, wherein said controller controls said moving member in such a manner that said first and second chamfered portions are partially overlapped with each other, and also said second and third chamfered portions are partially overlapped with each other.

5. The chamfering apparatus according to claim 1, wherein said controller controls said moving member in such a manner that each of said first, second and third chamfered portions is continuously provided on said notch groove and a circular peripheral side surface of said wafer.

6. The chamfering apparatus according to claim 1, wherein said disc shaped grindstone comprises at least two grindstone elements which are co-axially and rotatably supported by said grindstone frame and are replaceable with one another.

7. The chamfering apparatus according to claim 6, wherein said at least two grindstone elements are provided on one side of said grindstone frame.

8. The chamfering apparatus according to claim 1, wherein the disc shaped grindstone is capable of grinding a surface with a surface roughness of Rmax 0.1 µm or less.

9. A method of chamfering a wafer with a notch groove, in a chamfering apparatus including a holder for rotatably holding a wafer with a notch groove, a grindstone frame rotatably supporting a disc shaped grindstone capable of grinding a surface with a surface roughness of Rmax 0.5 µm or less, said grindstone having a peripheral side surface at a leading end in its radial direction which has a curvature radius in a cross-section smaller than a minimum curvature radius of said notch groove, said cross section obtained by cutting with a plane containing the center axis of the grindstone, said central line of said wafer and the central line of said grindstone defining a skew line relationship, a moving member capable of moving said grindstone relative to said wafer along said notch groove of said wafer on a parallel-extending plane which is in parallel with the principal plane of said wafer and moving at least one of said grindstone and said wafer so as to relatively move said grindstone and said wafer substantially along the chamfering shape of said wafer on an intersecting plane intersecting said parallel-extending plane at a predetermined angle, and a controller controlling the relative movements between said wafer and said grindstone on the parallel-extending plane and the intersecting plane, wherein said method comprises:

causing said grindstone to act on said notch groove while moving said grindstone relative to said wafer in such a manner that a contact position therebetween is moved along said notch groove while a first tool moving locus is drawn on a first parallel plane which is in parallel with said principal plane of said wafer, to thereby perform chamfering a first chamfered portion along said notch groove;

relatively moving said grindstone and said wafer in such a manner that the contact position therebetween is moved in accordance with a chamfered shape of said notch groove so as to allow said contact position to correspond to a second chamfered portion of said notch groove while a second tool moving locus is drawn on a first intersecting plane intersecting said parallel-extending plane at the predetermined angle, said second chamfered portion being substantially different from said first chamfered portion thus chamfered;

causing said grindstone to act on said notch groove while moving said grindstone relative to said wafer in such a manner that the contact position therebetween is moved along said notch groove while a third tool moving locus is drawn on a second parallel plane which is in parallel with said principal plane of said wafer and is different form said first parallel plane, to thereby perform chamfering the second chamfered portion along said notch groove; and relatively moving said grindstone and said wafer in such a manner that the contact position therebetween is moved in accordance with the chamfered shape of said notch groove so as to allow said contact position to correspond to a third chamfered portion of said notch groove while a fourth tool moving locus is drawn on a second intersecting plane intersecting said parallel-extending plane at the predetermined angle, said third chamfered portion being substantially different from said first and second chamfered portions thus chamfered; and causing said grindstone to act on said notch groove while moving said grindstone relative to said wafer in such a manner that the contact position therebetween is moved along said notch groove while a fifth tool moving locus is drawn on a third parallel plane which is in parallel with said principal plane of said wafer and is different from said first and second parallel planes, to thereby perform chamfering the third chamfered portion along said notch groove, relatively moving said grindstone and said wafer in such a manner that the contact position therebetween is moved in accordance with the chamfered shape of said notch groove so as to allow said contact position to correspond to a fourth chamfered portion of said notch groove while a sixth tool moving locus is drawn on a third intersecting plane intersecting said parallel-extending plane at the predetermined angle, said fourth chamfered portion being substantially different from said first, second and third chamfered portions thus chamfered; and causing said grindstone to act on said notch groove while moving said grindstone relative to said wafer in such a manner that the contact position therebetween is moved along said notch groove while a seventh tool moving locus is drawn on a fourth parallel plane which is in parallel with said principal plane of said wafer and is different from said first, second and third parallel planes, to thereby perform chamfering the fourth chamfered portion along said notch groove;

relatively moving said grindstone and said wafer in such a manner that the contact position therebetween is moved in accordance with the chamfered shape of said notch groove so as to allow said contact position to correspond to a fifth chamfered portion of said notch groove while an eighth tool moving locus is drawn on a fourth intersecting plane intersecting said parallel-extending plane at the predetermined angle, said fifth chamfered portion being substantially different from said first, second, third and fourth chamfered portions thus chamfered; and causing said grindstone to act on said notch groove while moving said grindstone relative to said wafer in such a manner that the contact position therebetween is moved along said notch groove while a ninth tool moving locus is drawn on a fifth parallel plane which is in parallel with said principal plane of said wafer and is different from said first, second, third and fourth parallel planes, to thereby perform chamfering the fifth chamfered portion along said notch groove, thereby chamfering said notch groove into a polygonal shape having at least five surfaces.

10. The chamfering method according to claim 9, wherein said first intersecting plane is different from said second intersecting plane.

11. The chamfering method according to claim 9, wherein said predetermined angle is about 90 degrees.

12. The chamfering method according to claim 9, wherein parts of said first and second chamfered portions are overlapped with each other, and parts of said second and third chamfered portions are overlapped each other.

13. The chamfering method according to claim 9, further comprising the steps of:

continuously chamfering a circular peripheral side surface of said wafer to provide at least one of said first, second and third chamfered portions thereon.

14. A disc-shaped semiconductor wafer made by the method according to claim 6, comprising:

a notch groove formed at a periphery of the wafer, wherein said notch groove is chamfered into a polygonal shape that is a pentagon or greater in a cross section taken along a plane containing the center axis of said wafer.

15. The wafer according to claim 14, wherein said polygonal shape is defined by nine or more chamfered surfaces.

16. The wafer according to claim 15, wherein said polygonal shape is defined by surfaces each of which is formed into a concave shape.

17. The wafer according to claim 14, wherein said polygonal shape is defined by surfaces each of which is formed into a concave shape.

18. The wafer according to claim 14, wherein a bus line of the outermost chamfered surface is extended in parallel with the center line of the wafer.

19. The wafer according to claim 14, wherein each of chamfered surfaces defining said polygonal shape has a maximum surface roughness of less than 0.5 $\mu$m.

20. The wafer according to claim 19, wherein each of chamfered surfaces defining said polygonal shape has a maximum surface roughness of about 0.1 μm.

21. The disc-shaped semiconductor wafer according to claim 14, wherein said polygonal shape is defined by five or more chamfered surfaces.

22. The chamfering apparatus according to claim 9, wherein said polygonal shape is defined by five or more chamfered surfaces.

23. The chamfering apparatus according to claim 9, further comprising:

replacing said grindstone with another grindstone, wherein said grindstone and said other grindstone are co-axially and rotatably supported by said grindstone frame.

24. The chamfering apparatus according to claim 9, wherein said causing steps and said moving steps are continuously conducted in such manner that said contact position is moved so as to be drawn in a reciprocating, continuous line.

25. The chamfering apparatus according to claim 24, wherein said causing steps and said moving steps are continuously conducted from the upper position of the wafer towards the lower position of the wafer.

26. The chamfering method according to claim 9, wherein the disc shaped grindstone is capable of grinding a surface with a surface roughness of Rmax 0.1 μm or less.

* * * * *